United States Patent
Park et al.

(10) Patent No.: US 7,215,026 B2
(45) Date of Patent: May 8, 2007

(54) SEMICONDUCTOR MODULE AND METHOD OF FORMING A SEMICONDUCTOR MODULE

(75) Inventors: Chang-Yong Park, Cheonan-si (KR); Byung-Man Kim, Cheonan-si (KR); Dong-Chun Lee, Cheonan-si (KR); Yong-Hyun Kim, Suwon-si (KR); Kwang-Seop Kim, Yongin-si (KR); Dong-Woo Shin, Cheonan-si (KR); Kwang-Ho Chun, Asan-si (KR)

(73) Assignee: Samsung Electonics Co., Ltd, Gyeonggi-do (KR)

( * ) Notice: Subject to any disclaimer, the term of this patent is extended or adjusted under 35 U.S.C. 154(b) by 0 days.

(21) Appl. No.: 11/246,303

(22) Filed: Oct. 11, 2005

(65) Prior Publication Data
US 2006/0231949 A1    Oct. 19, 2006

Related U.S. Application Data

(60) Provisional application No. 60/671,091, filed on Apr. 14, 2005.

(30) Foreign Application Priority Data
Apr. 15, 2005    (KR) .................... 10-2005-0031618

(51) Int. Cl.
*H01L 23/12* (2006.01)
(52) U.S. Cl. .................. 257/737; 257/723; 257/738; 257/778; 257/780; 257/786; 257/E23.01; 257/25.001

(58) Field of Classification Search ............... 257/723, 257/737
See application file for complete search history.

(56) References Cited

U.S. PATENT DOCUMENTS

| | | | | |
|---|---|---|---|---|
| 5,220,200 A | * | 6/1993 | Blanton ...................... 257/778 |
| 5,700,715 A | * | 12/1997 | Pasch ......................... 438/613 |
| 5,726,502 A | * | 3/1998 | Beddingfield ............... 257/797 |
| 5,801,447 A | * | 9/1998 | Hirano et al. ............... 257/778 |
| 6,518,654 B1 | | 2/2003 | Bolken et al. |
| 6,552,425 B1 | * | 4/2003 | Yan et al. .................... 257/690 |
| 6,650,005 B2 | | 11/2003 | Hung et al. |
| 6,651,321 B2 | * | 11/2003 | Beroz et al. .................. 29/840 |
| 6,727,718 B2 | * | 4/2004 | Ichihara et al. ............. 324/755 |
| 2002/0185746 A1 | * | 12/2002 | Park ........................... 257/778 |

FOREIGN PATENT DOCUMENTS

JP    2001-94244 A    4/2001

* cited by examiner

*Primary Examiner*—Minhloan Tran
*Assistant Examiner*—Eduardo A. Rodela
(74) *Attorney, Agent, or Firm*—Harness, Dickey & Pierce, PLC

(57) ABSTRACT

In one embodiment, a semiconductor module includes at least one semiconductor chip package, a board having functional pads and dummy pads, and at least one solder joint electrically connecting the semiconductor chip package and one of the functional pads of the board. Furthermore, at least one supporting solder bump is formed on one of the dummy pads and disposed under a portion of the semiconductor chip package. For example, the supporting solder bump may be disposed under a peripheral area of the semiconductor chip package.

36 Claims, 16 Drawing Sheets

the contents of which are herein incorporated by

SEMICONDUCTOR MODULE AND METHOD OF FORMING A SEMICONDUCTOR MODULE

DOMESTIC PRIORITY INFORMATION

This application claims priority under 35 USC § 119 to U.S. Provisional Application No. 60/671,091 filed Apr. 14, 2005, the contents of which are herein incorporated by reference in their entirety.

FOREIGN PRIORITY INFORMATION

This application claims priority under 35 USC § 119 to Korean Patent Application No. 2005-31618 filed on Apr. 15, 2005, the contents of which are herein incorporated by reference in their entirety.

BACKGROUND OF THE INVENTION

1. Field of the Invention

The present invention relates to semiconductor modules such as a module printed circuit board (PCB) with one or more semiconductor chip packages mounted thereon, and a method of forming the semiconductor module.

2. Description of the Related Art

Recently, semiconductor modules, such as memory modules, have been widely employed in various multi-media apparatuses and digital apparatuses where the semiconductor modules have rapid response speed, low power consumption, minute sizes, etc. Generally, ball grid array (BGA) semiconductor chip packages are employed in the semiconductor modules.

The BGA semiconductor chip packages are usually divided into a micro BGA type, a wire bonding BGA (WBGA) type and a board on chip (BOC) type. A semiconductor package including a BGA is combined with a module board using solder balls instead of leads. About two to about thirty-two units of the BGA semiconductor chip packages are usually mounted on one module board.

FIGS. 1A and 1B are cross-sectional views illustrating a manual socketing procedure for a semiconductor module including conventional BGA semiconductor chip packages and a conventional printed circuit board (PCB). Referring to FIGS. 1A and 1B, a PCB 10 includes BGA semiconductor chip packages 150, such as memory chip packages, mounted thereon. As is well-known, the solders balls of the BGA semiconductor chip packages 150 are mounted to the PCB 10 forming solder joints between the PCB 10 and the BGA semiconductor chip packages 150.

The PCB 10 is socketed into a socket 20 by a manual socketing procedure. In this procedure, one or more of the BGA semiconductor chip packages 150 may be grasped by the person inserting the PCB 10 into the socket 20. This may cause a BGA semiconductor chip package 150 to become bent or twisted, and a crack in the BGA semiconductor chip package 150 may occur. When this happens, the electrical characteristics of the BGA semiconductor chip package 150 may decrease.

FIG. 2 is a plan view illustrating an example of a conventional BGA semiconductor package 150. As shown, the BGA semiconductor package 150 includes a BGA area in which solder balls 12 are arranged. The outermost solder balls 12 are separated from an edge of the BGA semiconductor chip package 150 by a gap of about 1 to about 3 mm. FIG. 3 is a cross-sectional view illustrating the cracking of the conventional BGA semiconductor chip package 150 when grasped. As shown, the BGA semiconductor chip package 150 may tend to crack along the outermost solder joint 14. Also, while not shown, grasping of the PCB 10 and/or the manual socketing procedure, may also result in a solder joint 14 cracking.

SUMMARY OF THE INVENTION

The present invention relates to a semiconductor module.

In one embodiment of the present invention, a semiconductor module includes at least one semiconductor chip package, a board having functional pads and dummy pads, and at least one solder joint electrically connecting the semiconductor chip package and one of the functional pads of the board. Furthermore, at least one supporting solder bump is formed on one of the dummy pads and is disposed under a portion of the semiconductor chip package. For example, the supporting solder bump may be disposed under a peripheral area of the semiconductor chip package.

In one embodiment, more than one supporting solder bump arrangement is formed on the board, and each supporting solder bump arrangement corresponds to a different sized semiconductor chip package.

In an embodiment, the supporting solder bump is disposed under the semiconductor chip package such that a gap exists between the semiconductor chip package and the supporting solder bump. In another embodiment, the supporting solder bump contacts the semiconductor chip package.

In yet another embodiment, the semiconductor module includes at least one semiconductor chip package, a board, and at least one solder joint electrically connecting the semiconductor chip package and the board. Furthermore, at least one supporting solder bump is formed on the board under a portion of the semiconductor chip package such that a gap exists between the semiconductor chip package and the supporting solder.

The present invention further relates to a method of forming a semiconductor module.

In one embodiment, the method includes the steps of forming functional and dummy pads on a board, and mounting at least one semiconductor chip package on the board such that at least one solder joint electrically connects the semiconductor chip package to one of the functional pads and at least one supporting solder bump is formed on at least one of the dummy pads disposed under the semiconductor chip package. For example, at least one of the supporting solder bumps may be disposed under a peripheral area of the semiconductor chip package.

In one embodiment of the method, the mounting step forms more than one supporting solder bump arrangement on the board, and each supporting solder bump arrangement corresponds to a different sized semiconductor chip package.

In an embodiment of the method, the supporting solder bump may be disposed under the semiconductor chip package such that a gap exists between the semiconductor chip package and the supporting solder bump, while in another embodiment, the supporting solder bump contacts the semiconductor chip package.

In another embodiment of the method of forming a semiconductor module, functional pads are formed on a board. Then at least one semiconductor chip package is mounted on the board such that at least one solder joint electrically connects the semiconductor chip package to one of the functional pads and at least one supporting solder bump is formed on the board under a portion of the semiconductor chip package such that a gap exists between the semiconductor chip package and the supporting solder.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EXAMPLE EMBODIMENTS

Figure 1A:
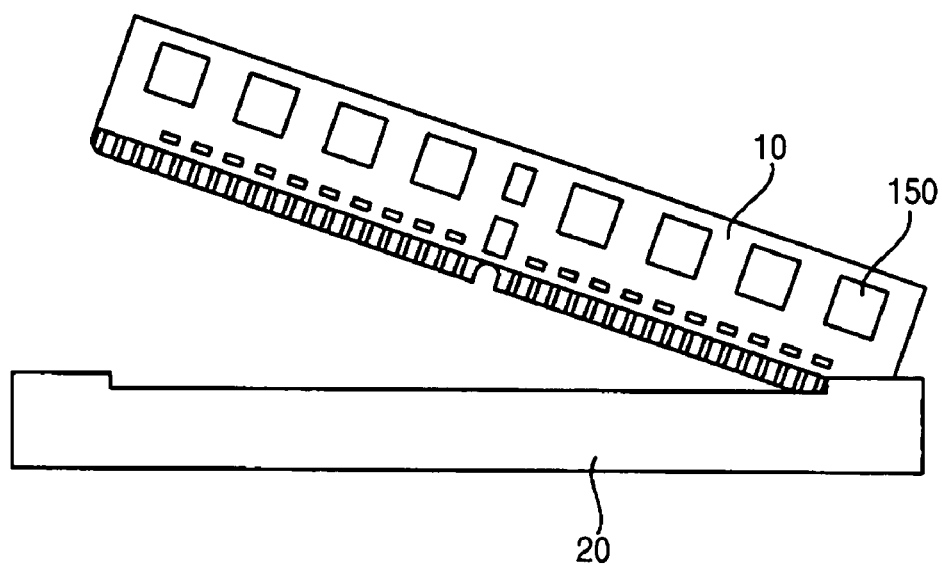
FIGS. 1A and 1B are cross-sectional views illustrating a manual socketing procedure for a semiconductor module including conventional BGA semiconductor chip packages and a conventional printed circuit board (PCB)
Figure 1B:
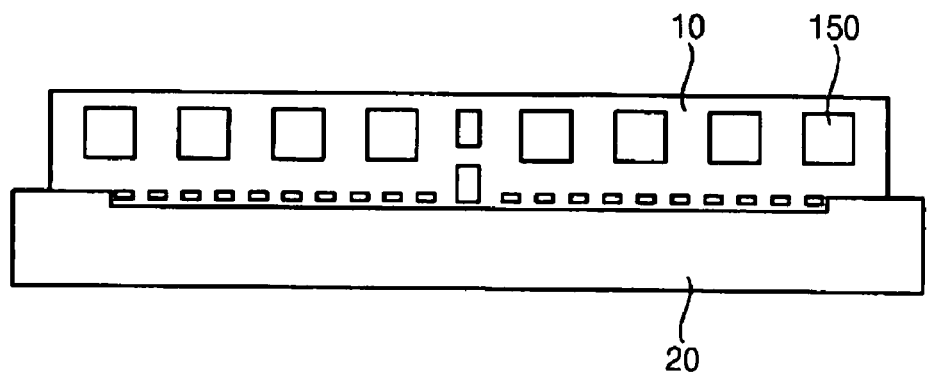
Figure 2:
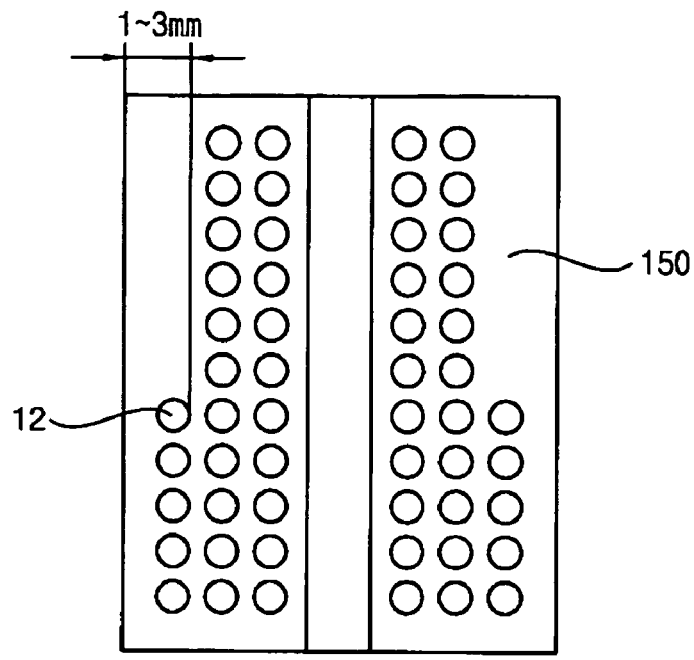
FIG. 2 is a plan view illustrating a conventional BGA semiconductor chip package.
Figure 3:
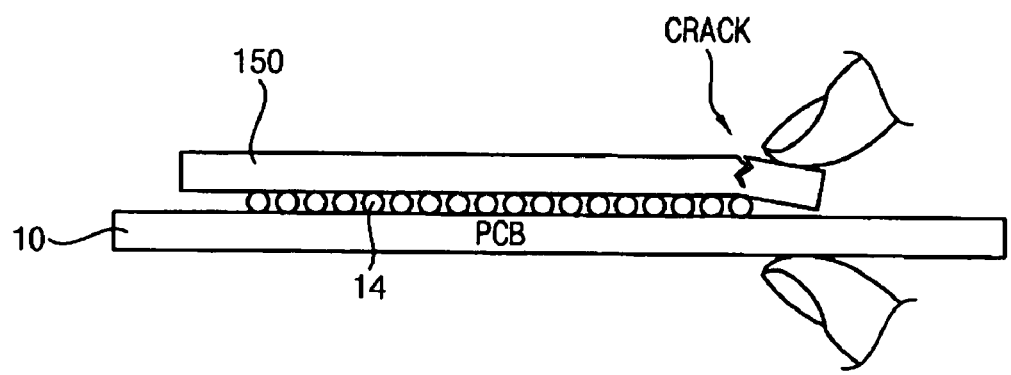
FIG. 3 is a cross-sectional view illustrating the cracking of the conventional BGA semiconductor chip package when grasped.

Example embodiments of the invention are described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout. As used herein, the term "and/or" includes any and all combinations of one or more of the associated listed items.

Figure 4:
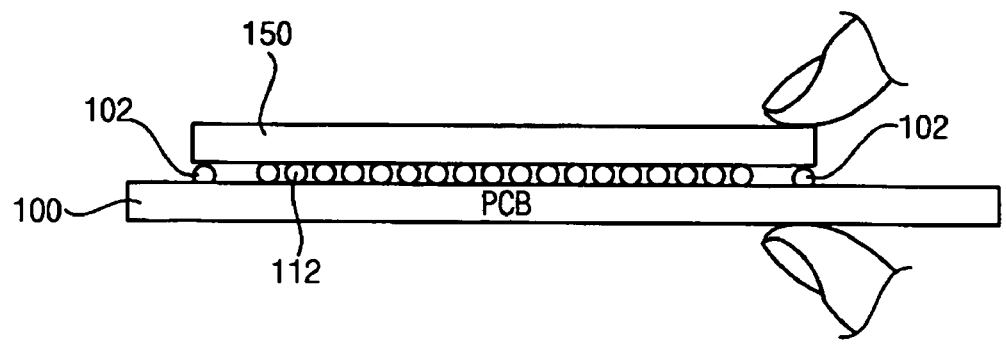
FIG. 4 illustrates a cross-sectional view of a semiconductor module according to an embodiment of the present invention.

FIG. 4 illustrates a cross-sectional view of a semiconductor module according to an embodiment of the present invention. As shown, the semiconductor module includes a printed circuit board (PCB) 100 with a semiconductor chip package 150 mounted thereon. It will be appreciated that while FIG. 4 illustrates only a single semiconductor chip package 150 because FIG. 4 represents a cross-sectional view, the PCB 100 may include more than one semiconductor chip 150 mounted thereon. As shown, a number of solder joints 112 connect the semiconductor chip package 150 to the PCB 100. These solder joints 112 may electrically connect and may also mechanically connect the semiconductor chip package 150 and the PCB 100.

The PCB 100 further includes supporting solder bumps 102. The supporting solder bumps 102 are disposed under the semiconductor chip package 150. For example, the supporting solder bumps 102 may be formed under a peripheral area of the semiconductor chip package 150 such as a corner portion of the semiconductor chip package 150. As will described in more detail below, the supporting solder bumps 102 may contact the semiconductor chip package 150, or a gap may exist between the semiconductor chip package 150 and the supporting solder bumps 102.

Next a method of forming a semiconductor module as shown in FIG. 4 according to an embodiment of the present invention will be described with respect to FIGS. 5–11.

Figure 5:
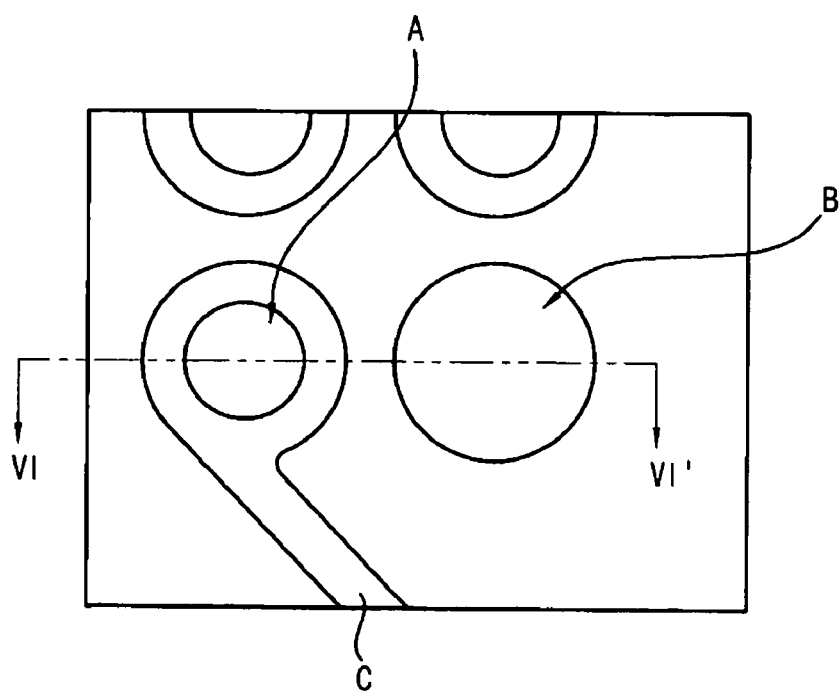
FIG. 5 is a plan view illustrating a printed circuit board including a normal, functional solder portion that becomes part of a solder joint and a supporting solder portion that becomes a supporting solder bump in accordance with an example embodiment of the present invention.

FIG. 5 is a plan view illustrating a PCB 100 including a normal, functional solder A that becomes part of a solder joint and a supporting solder B that becomes a supporting solder bump in accordance with an example embodiment of the present invention. As shown, leads or contact lines C on the PCB 100 electrically connect to the functional solder A. For the purposes of explanation, the method according to an embodiment of the present invention will be described with respect to cross-sectional views taken along line VI—VI in FIG. 5.

Figure 6:
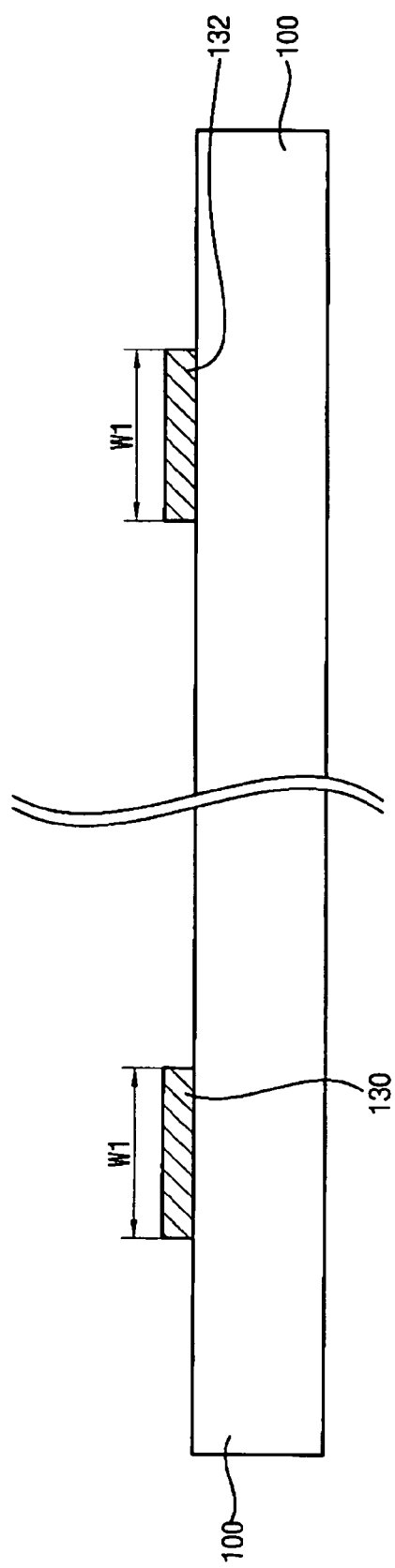
FIGS. 6 to 11 are cross-sectional views illustrating a method of forming the semiconductor module as shown in FIG. 5 in accordance with an example embodiment of the present invention.

FIGS. 6–9 are cross-sectional views illustrating a method of forming a normal, functional solder and a supporting solder as shown in FIG. 5 in accordance with an example embodiment of the present invention. Referring to FIG. 6, at least one normal, functional pad 130 is formed on a portion of a PCB 100 corresponding to a solder joint 112 attached to a portion of the semiconductor chip package 150. Furthermore, at least one dummy pad 132 is formed on a portion of the PCB 100 corresponding to, for example, a peripheral portion of the semiconductor package 150. The functional pad 130 and dummy pad 132 may be formed in the same processing step and of the same material. The functional pad 130 and dummy pad 132 may be formed of copper, copper alloy, etc. as is well-known in the art. For example, the functional pad 130 and the dummy pad 132 may include stacked layers of copper, nickel and gold. The present invention, however, is not limited to having the functional pad 130 and the dummy pad 132 formed of the same material.

FIG. 6 also shows the functional pad 130 and the dummy pad 132 having a same width W1. Again, the functional pad 130 and dummy pad 132 may have the same width (e.g., 350 um) and/or shape, or be formed to have different sizes and/or shapes.

Figure 7:
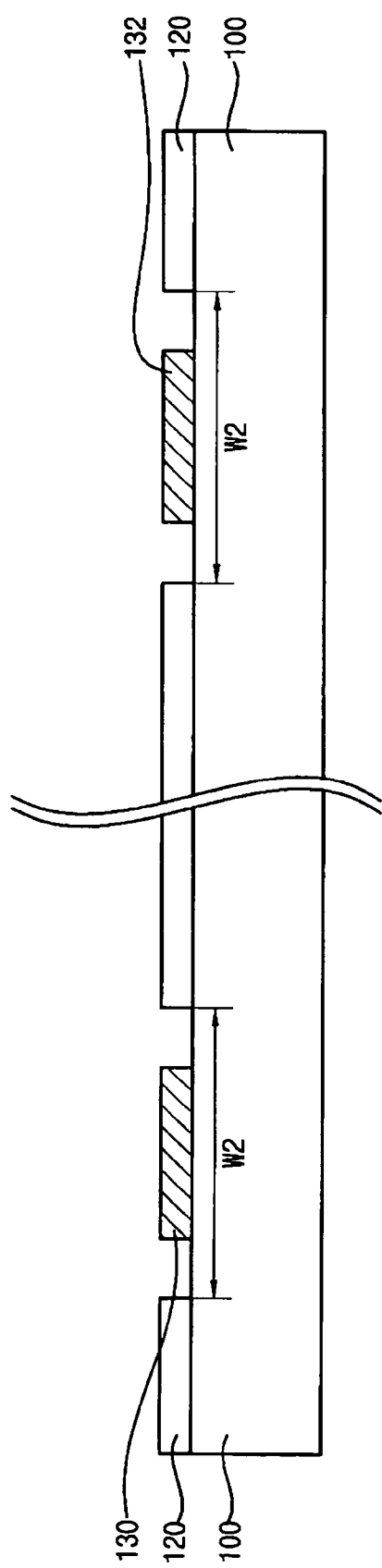

Referring to FIG. 7, a photo-solder resist (PSR) pattern 120 is formed on the PCB 100 such that the functional pad 130 and the dummy pad 132 are exposed. The PSR 120 may be well-known PSR 4000, and/or include at least one of Ba, Si and Cl. As shown, the PSR 120 defines openings of width W2 exposing the functional pad 130 and the dummy pad 132. As shown, the width W2 is sufficient to expose the respective pad and a portion of the PCB Furthermore, while the openings exposing the functional pad 130 and the dummy pad 132 have a same size, it will be understood that the present invention is not limited to the openings having a same size.

Figure 8:
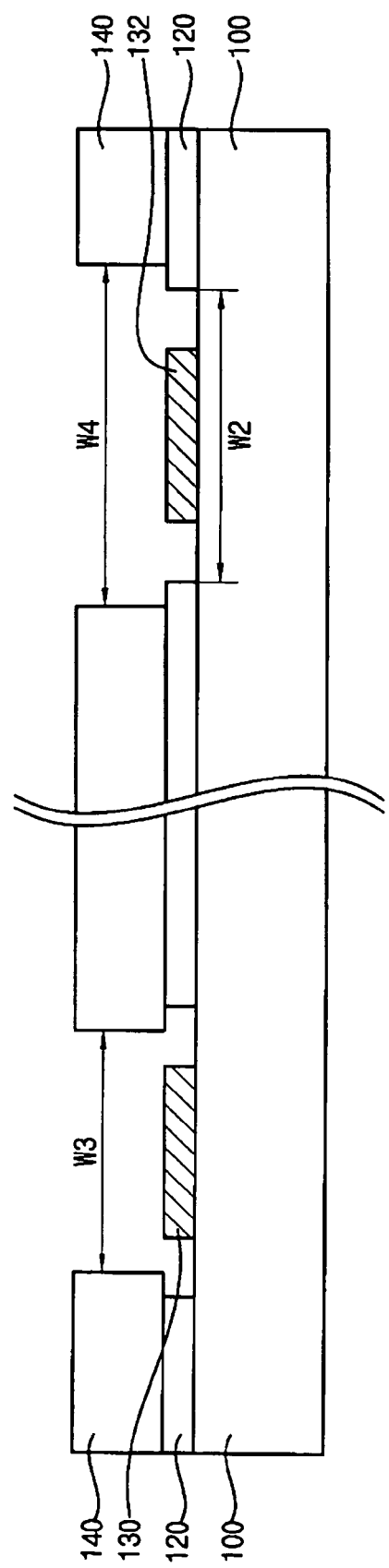

Next, functional solder and supporting solder is formed on the functional solder pads 130 and dummypads 132, for example, by employing surface mount technology (SMT). As shown in FIG. 8, a stencil 140 is formed over the PCB 100 such that the functional pad 130 and the dummy pad 132 are exposed. More particularly, FIG. 8 illustrates the stencil 140 defining a first opening having width W3, which exposes the functional pad 130, and defining a second opening having a width W4, which exposes the dummy pad In this embodiment, the width W4 (e.g., 750 um) of the second opening is greater than the width W3 (e.g., 400 um) of the first opening. However, it will be understood that the present invention is not limited to this relationship. Instead, the second opening may have the same width as the first opening or have a width less than the first opening.

Furthermore, FIG. 8 illustrates that the width W3 of the first opening is less than the width W2 of the opening in the PSR 120 exposing the functional pad 130, and illustrates that the width W4 of the second opening is greater than the width W2 of the opening in the PSR 120 exposing the dummy pad 132. However, it will be understood that the present invention is not limited to these relationships. Instead, the width W3 may be equal to or greater than the width W2, and the width W4 may be equal to or less than the width W2.

Figure 9:
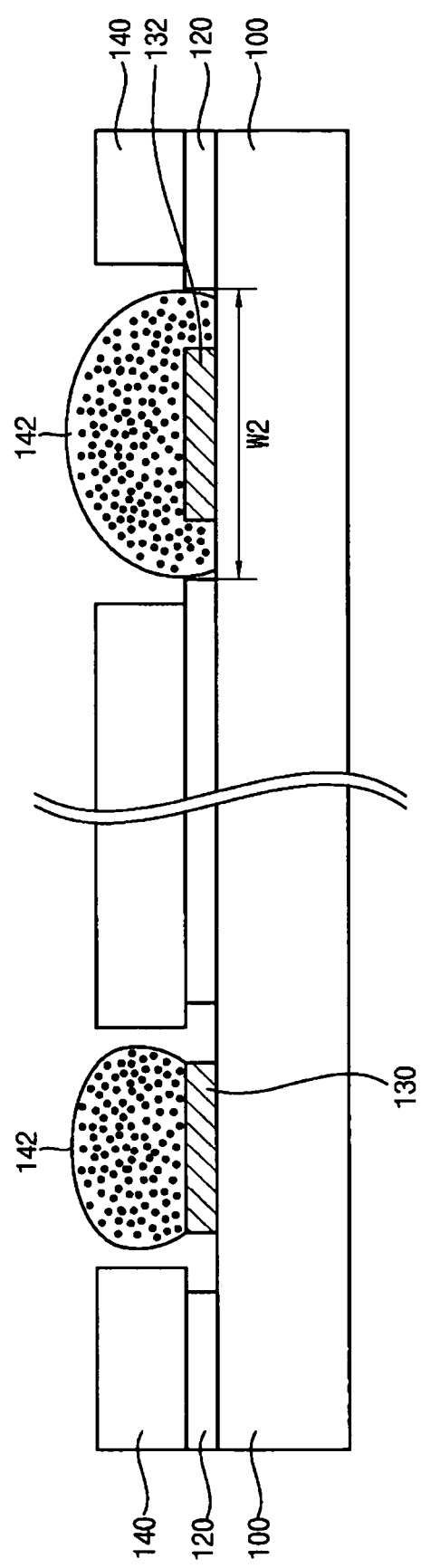
Figure 10:
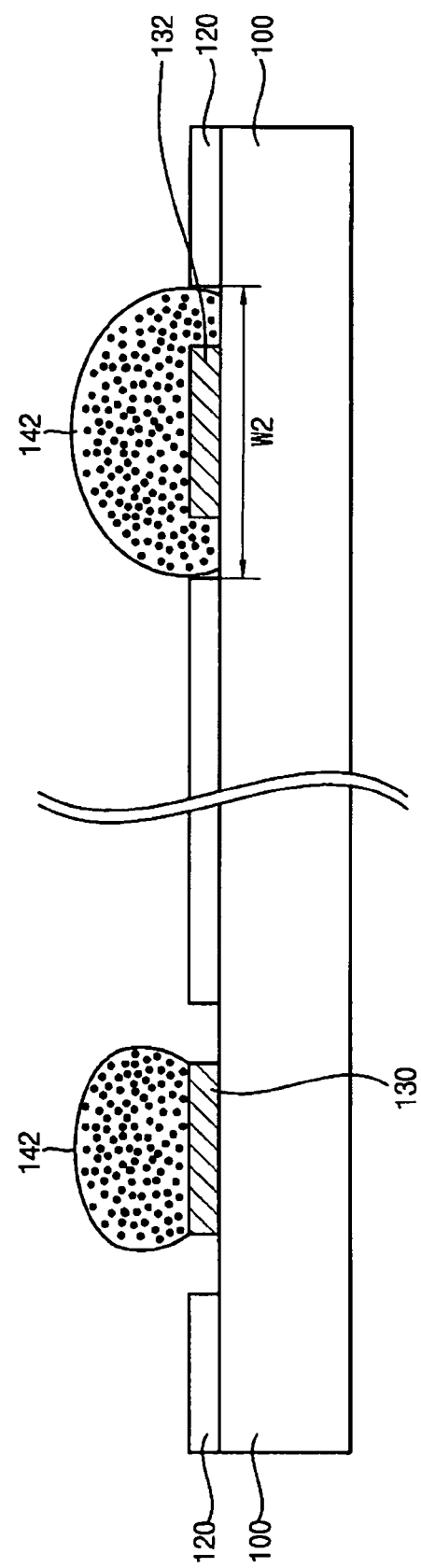

As shown in FIG. 9, a solder paste is deposited over the PCB 100, for example, by screen printing to form functional solder paste portions 142 over the functional pads 130 and supporting solder paste portions 144 over the dummy pads 132. The stencil 140 is then removed as shown in FIG. 10.

Figure 11:
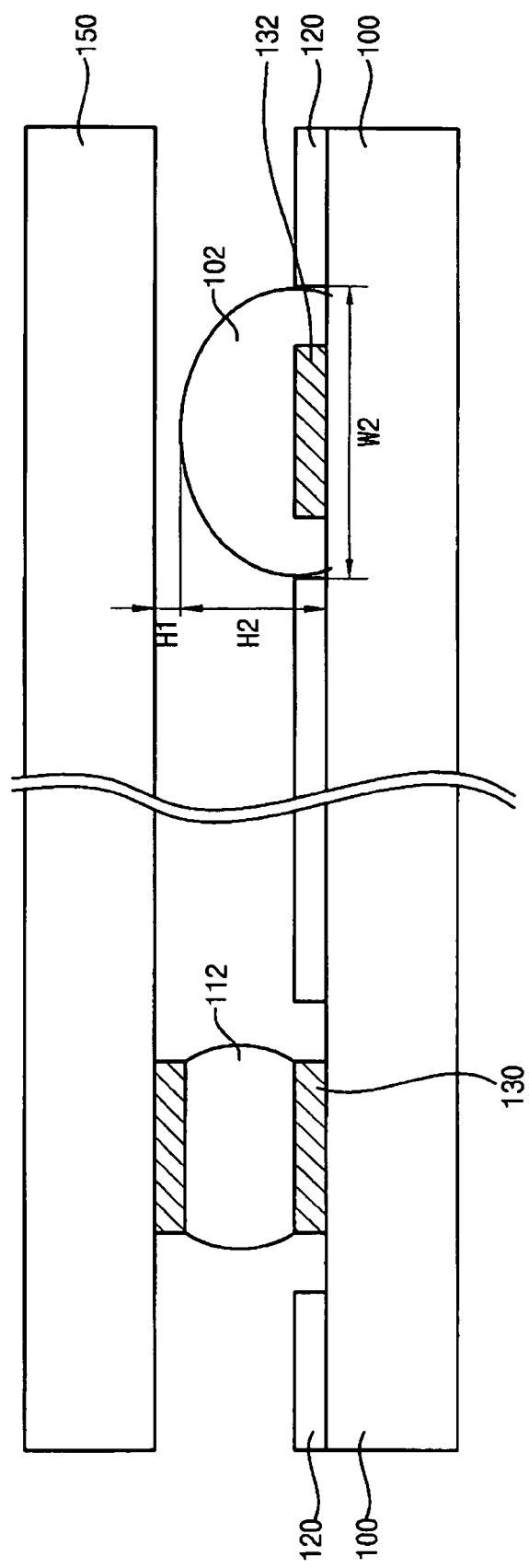

Next, the semiconductor chip packages 150 are aligned on the PCB 100, and a well-known thermal process such as a reflow process is conducted. As shown in FIG. 11, the reflow process results in the functional solder paste 142 joining with a respective solder ball of the semiconductor chip package 150 to form one of the solder joints 112 (see also FIG. 4). Furthermore, the supporting solder paste 144 becomes the supporting solder bump 102 (see also FIG. 4). The solder joints 112 and supporting solder bumps 102 may be an alloy of tin (Sn) such as an alloy of SnPB, or may be a leadless alloy such as SnAgCu.

As shown in FIG. 11, the supporting solder bump 102 has a height H2 such that a gap H1 exists between the supporting solder bump 102 and the semiconductor chip package 150. The height of the supporting solder bump H2, and therefore the size of the gap H1, depends in part on the width W4 of the second opening in the stencil 140 that exposes the supporting solder pad 132. Table 1 below shows the heights H2 of the supporting solder bumps 102 and the gaps H1 between the supporting solder bumps 102 and the semiconductor chip package 150 in accordance with variations in the width W4 of the second opening in the stencil 140.

TABLE

| | second opening width W4 in stencil [μm] | | | |
| --- | --- | --- | --- | --- |
| | 550 | 650 | 750 | 850 |
| mean height [mm] | 0.17908 | 0.21180 | 0.24819 | 0.27831 |
| deviation of heights [mm] | 0.00336 | 0.00248 | 0.00340 | 0.00407 |
| minimum height [mm] | 0.16920 | 0.20350 | 0.24240 | 0.27210 |

TABLE-continued

| | second opening width W4 in stencil [μm] | | | |
| --- | --- | --- | --- | --- |
| | 550 | 650 | 750 | 850 |
| maximum height [mm] | 0.18690 | 0.22320 | 0.25450 | 0.28870 |
| gap [mm] | 94.0296 | 49.2530 | 28.3580 | 0.0 |

As shown in the above Table, as the width W4 of second opening in the stencil 140 increases, the height H2 of the supporting solder bumps 102 increases so that the gap H1 between the supporting solder bumps 102 and the semiconductor chip package 150 decreases.

Figure 12:
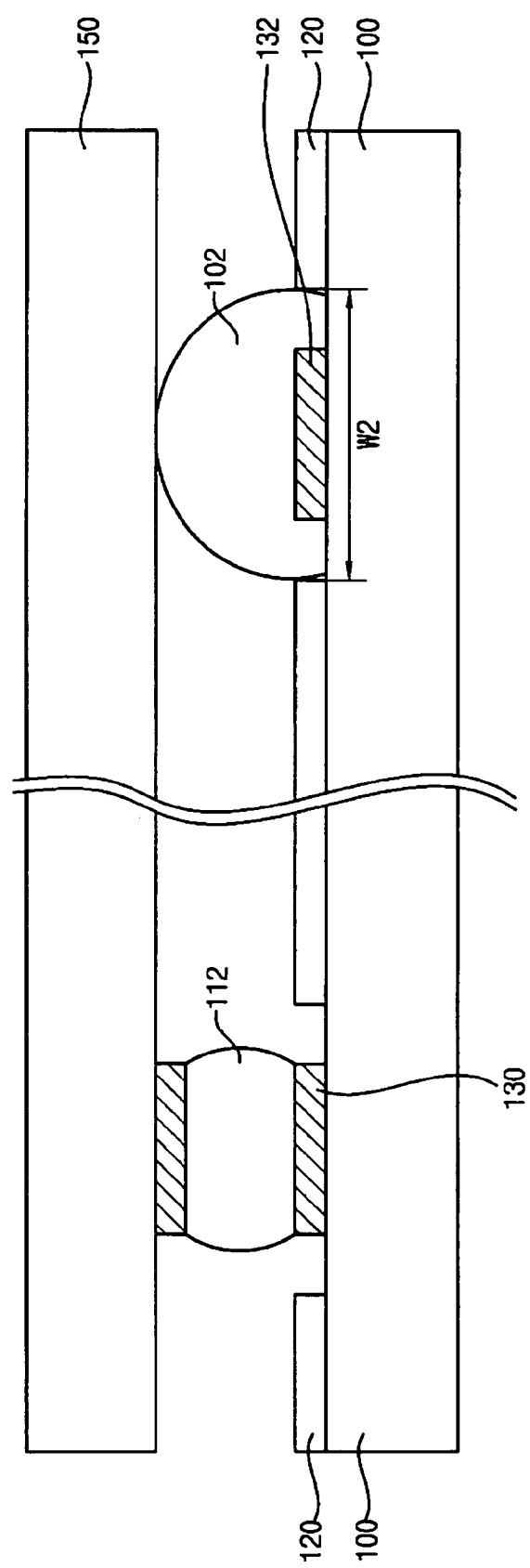
FIG. 12 illustrates an embodiment of the present invention in which the supporting solder bumps contact the semiconductor chip package of the semiconductor module.

For example, when the width W4 is about 550 μm, the mean height of the supporting solder bumps 102 is about 0.17908 mm, and the gap H1 between the supporting solder bumps 102 and the semiconductor chip package 150 is about 94.0299 μm. When the width W4 is about 650 μm, the mean height of the supporting solder bumps 102 is about 0.21180 mm, and the gap H1 between the supporting solder bumps 102 and the semiconductor chip package 150 is about 49.253 μm. When the width W4 is about 750 μm, the mean height of the supporting solder bumps 102 is about 0.24819 mm, and the gap H1 between the supporting solder bumps 102 and the semiconductor chip package 150 is about 28.3581 μm. When the width W4 is about 850 μm, the mean height of the supporting solder bumps 102 is about 0.27831 mm, and the gap H1 between the supporting solder bumps 102 and the semiconductor chip package 150 is about 0.0 μm so that the supporting solder bumps 102 substantially make contact with the semiconductor chip package 150. This last example is illustrated in FIG. 12. In one embodiment, the height H2 of the supporting solder bumps 102 is controlled such that the gap H1 is between 10 to 20 um.

The ratio of the gaps H1 relative to the heights H2 of the supporting solder bumps 102 may be below about 0.5 when the stencil has the thickness of about 0.12 mm. For example, the ratio of the gaps H1 relative to the heights H2 of the supporting solder bumps 102 is about 0.12 when the width W4 is about 550 μm. In addition, the ratio of the gaps H1 relative to the heights H2 of the supporting solder bumps 102 is about 0.23 when the width W4 is about 650 μm. Furthermore, the ratio of the gaps H1 relative to the heights H2 of the supporting solder bumps 102 is about 0.11 when the width W4 is about 750 μm. When the width W4 is about 650 μm, the ratio of the gaps H1 relative to the heights H2 of the supporting solder bumps 102 is about 0.23.

The heights H2 of the supporting solders 102 may also be adjusted by varying the width W2 of the opening in the PSR 120 that exposes the dummy pad 132, by varying the width W1 of the dummy pads 132 and/or the thickness of the stencil 140. Namely, as the width W2 of the opening in the PSR 120 that exposes the dummy pad 132 decreases, the heights H2 of the supporting solder bumps 102 also decrease.

When the supporting solder bumps 102 are disposed on portions of the PCB 100 corresponding to edge or peripheral portions of the semiconductor chip package 150, a pressing pressure applied by when the semiconductor module is grasped (e.g., during the manual socketing procedure) may be uniformly distributed about the semiconductor chip package 150, thereby preventing the generation of a crack in the semiconductor chip package 150 and/or between the functional solder joint 112 and the semiconductor chip package 150.

Figure 13:
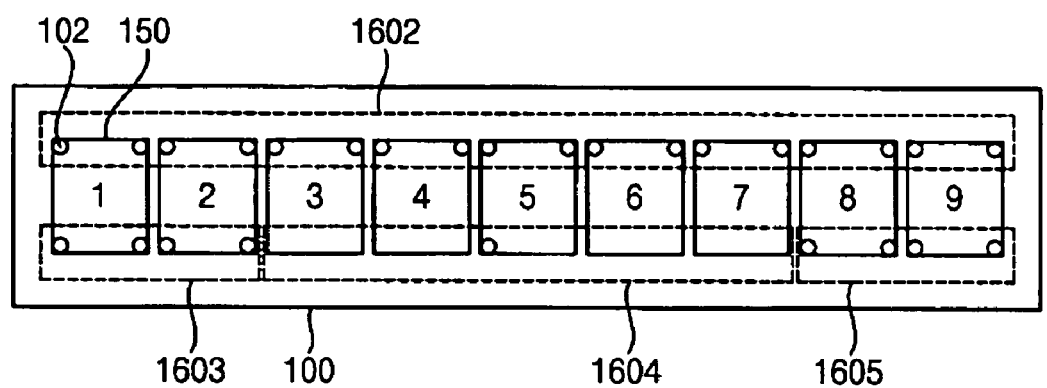
FIGS. 13–15 are plan views illustrating arrangements of supporting solder bumps in accordance with different example embodiments of the present invention.

FIG. 13 is a plan view illustrating an arrangement of supporting solder bumps 102 in accordance with an example embodiment of the present invention. For example, the arrangement of the supporting solder bumps 102 in FIG. 13 may be employed for an UDIMM PCB module or an RDIMM PCB module of a DDR II device. As shown, when first to ninth semiconductor chip packages 150, labeled 1, 2, 3, . . . , 9 in FIG. 13, are mounted on a PCB 100, the supporting solder bumps 102 may be formed on a first portion 1602, a second portion 1603 and a third portion 1605 of the PCB 100 corresponding to edge or peripheral portions of the first to the ninth semiconductor chip packages 1, 2, 3, . . . , 9. In FIG. 13, the supporting solder bumps 102 are shown formed at corner portions of respective semiconductor chip packages, but may be formed anywhere under the edge of the semiconductor chip packages.

Signal lines may be disposed at a fourth portion 1604 of the PCB 100 so that the supporting solder bumps 102 may be selectively formed on the fourth portion 1604 of the PCB 100 in consideration of the electrical characteristics of the PCB 100. For example, the supporting solder bumps 102 may be formed on the fourth portion 1604 of the PCB 100 corresponding to a left edge portion (or a right edge portion) of the fifth semiconductor chip package 5.

In another example embodiment of the present invention, the PCB 100 may include semiconductor chip packages 150 mounted on opposite faces of the PCB 100. Each face may include the same arrangement of semiconductor chip packages as shown in FIG. 13, and may also include the same arrangement of supporting solder bumps 102 as shown in FIG. 13.

Figure 14:
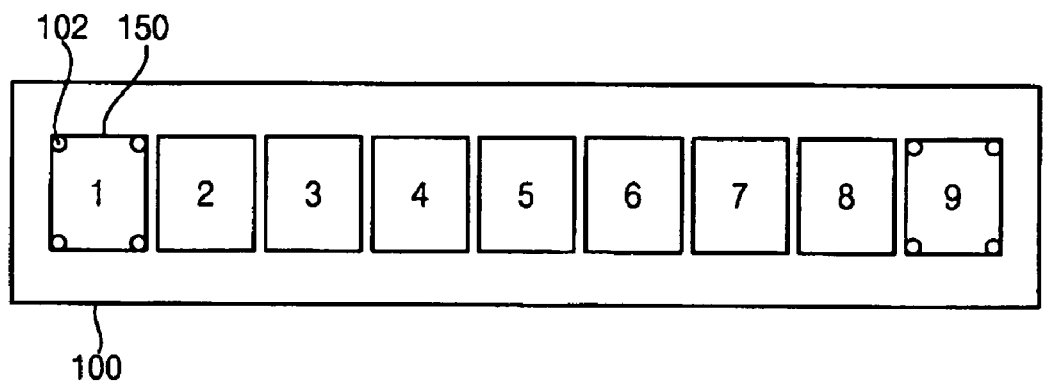

FIG. 14 is a plan view illustrating an arrangement of supporting solder bumps 102 in accordance with another example embodiment of the present invention. As shown, first to ninth semiconductor chip packages 150, labeled 1, 2, 3, . . . , 9 in FIG. 14, may be mounted on the PCB 100, and the supporting solder bumps 102 may be formed on portions of the PCB 100 corresponding to edge portions of the first semiconductor chip package 1 and the ninth semiconductor chip package 9. In FIG. 14, the supporting solder bumps 102 are shown formed at corner portions of respective semiconductor chip packages, but may be formed anywhere under the edge of the semiconductor chip packages.

Additional supporting solder bumps 102 may also be formed on portions of the PCB 100 corresponding to edge portions of the second semiconductor chip package 2 and the eighth semiconductor chip package 8, respectively.

In a further example embodiment of the present invention, the PCB 100 may include semiconductor chip packages 150 mounted on opposite faces of the PCB 100. Each face may include the same arrangement of semiconductor chip packages as shown in FIG. 14, and may also include the same arrangement of supporting solder bumps 102 as shown in FIG. 14.

In yet another example embodiment of the present invention, the arrangements of the supporting solder bumps 102 in FIGS. 13 or 14 may be employed for any number of semiconductor chip packages 150 mounted on one or both faces of the PCB 100. For example, the supporting solder bump arrangements of FIG. 13 or 14 may be employed for first to eighteenth semiconductor packages 150 mounted on one face of the PCB 100. As another example, the arrangements of the supporting solder bumps 102 in FIGS. 13 or 14 may be employed for first to the eighteenth semiconductor chip packages 150 mounted on a first face of the PCB 100, and nineteenth to the thirty-sixth semiconductor chip packages 150 mounted on the second face of the PCB 100.

Figure 15:
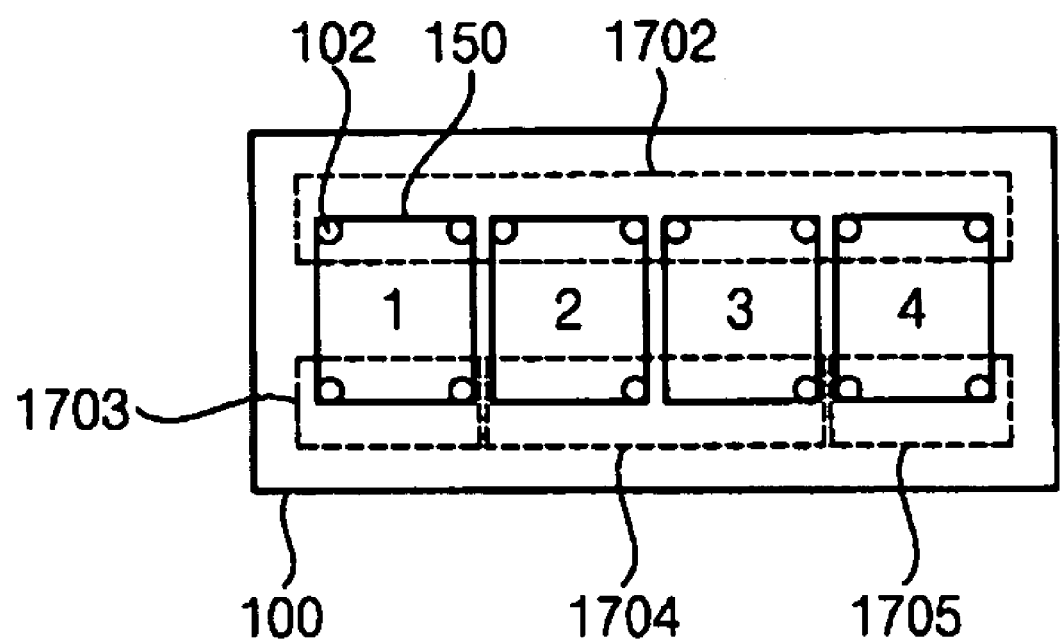

FIG. 15 is a plan view illustrating an arrangement of supporting solder bumps 102 in accordance with a further example embodiment of the present invention. The arrangement of the supporting solder bumps 102 in FIG. 15 may be employed for a SODIMM PCB module of a DDR II device. As shown, first to fourth semiconductor chip packages 150, labeled 1, 2, 3 and 4 in FIG. 15, are mounted on a PCB 100. The supporting solder bumps 102 may be formed on a first portion 1702, a second portion 1703 and a third portion 1705 of the PCB 100 corresponding to edge or peripheral portions of the first to fourth semiconductor chip packages 1, 2, 3 and 4. In FIG. 15, the supporting solder bumps 102 are shown formed at corner portions of respective semiconductor chip packages, but may be formed anywhere under the edge of the semiconductor chip packages.

Signal lines may be disposed at a fourth portion 1704 of the PCB 100 so that the supporting solder bumps 102 may be selectively formed on the fourth portion 1704 of the PCB 100 in consideration of the electrical characteristics of the PCB 100. For example, the supporting solder bumps 102 may be formed on the fourth portion 1704 of the PCB 100 corresponding to a left edge portion (or a right edge portion) of the second semiconductor chip package 2. Alternatively, the supporting solder bumps 102 may be formed on the fourth portion 1704 of the PCB 100 corresponding to a left edge portion (or a right edge portion) of the third semiconductor chip package 3.

In another example embodiment of the present invention, the PCB 100 may include semiconductor chip packages 150 mounted on opposite faces of the PCB 100. Each face may include the same arrangement of semiconductor chip packages as shown in FIG. 15, and may also include the same arrangement of supporting solder bumps 102 as shown in FIG. 15.

Figure 16:
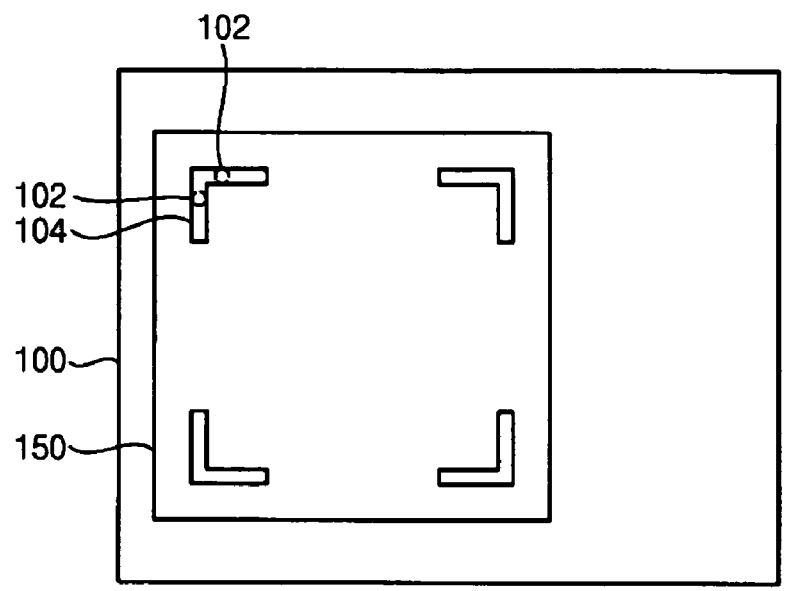
FIGS. 16 and 17 illustrate peripheral regions of a semiconductor chip package under which supporting solder bumps may be disposed.
Figure 17:
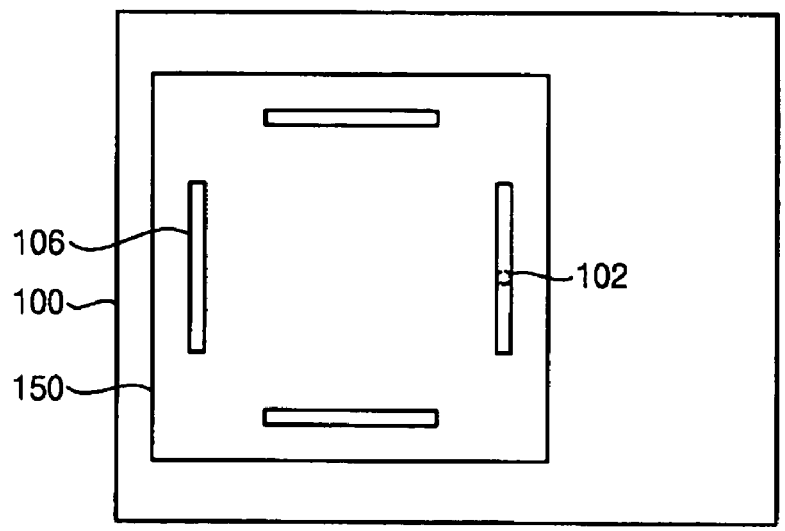

As discussed above with respect to the embodiments of FIGS. 13–15, the supporting solder bumps 102 may be arranged under the peripheral region of the semiconductor chip packages 150. FIGS. 16 and 17 illustrate this more clearly. Namely, FIG. 16 illustrates regions 104 under the corner portions of a semiconductor chip package 150 in which supporting solder bumps may be disposed, and further illustrates an example of two supporting solder bumps 102 disposed under a same corner portion. It will be understood, however, that more than two supporting solder bumps 102 may be formed under the same corner portion. FIG. 17 illustrates regions 106 under the edge portions of a semiconductor chip package 150 in which supporting solder bumps 102 may be disposed, and further illustrates an example of a supporting solder bump 102 disposed under an edge portion at its center.

Furthermore, it will be understood that for each of the supporting solder bump positions discussed above, and further discussed below, a corresponding dummy pad may be likewise positioned and the supporting solder bump may be disposed on the dummy pad.

Figure 18:
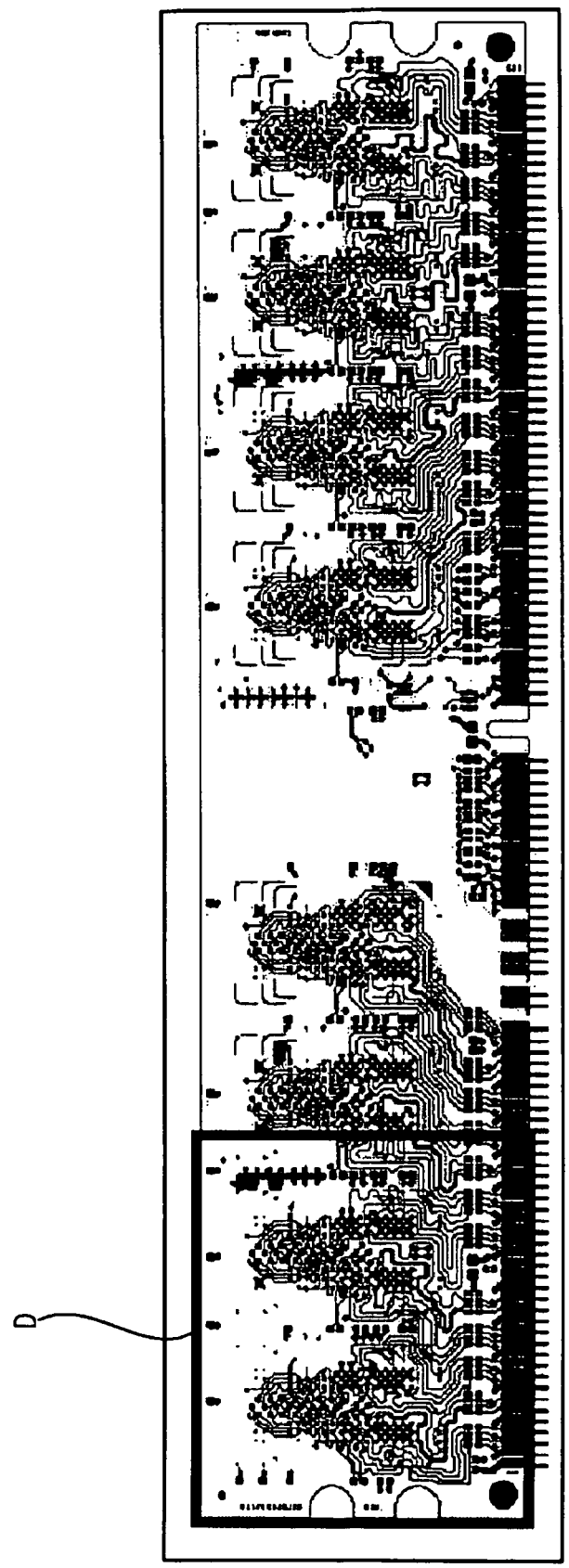
FIG. 18 is a picture showing a dual module PCB with different arrangements of supporting solder bumps in accordance with an example embodiment of the present invention.
Figure 19:
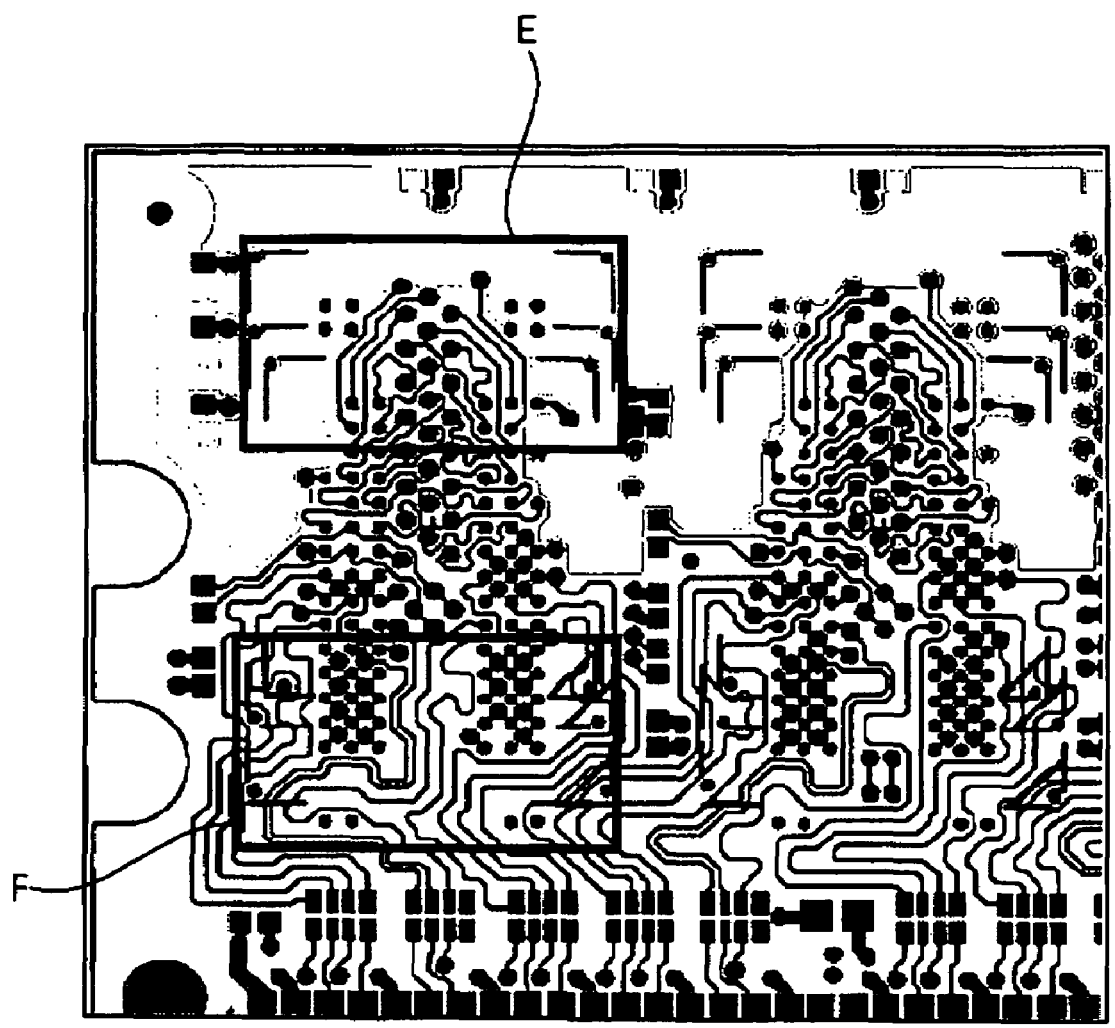
FIG. 19 is an enlarged picture showing section "D" in FIG. 18.
Figure 20:
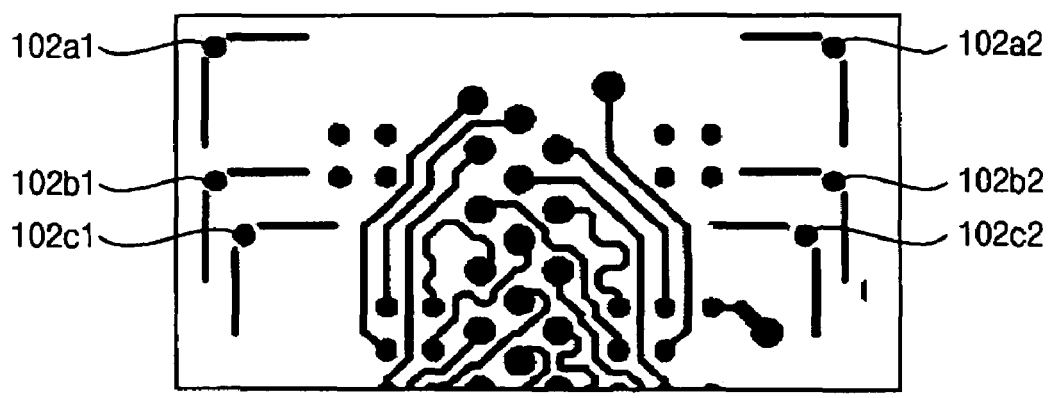
FIG. 20 is an enlarged picture showing section "E" in FIG. 19.

FIG. 18 is a picture showing a dual module PCB with an arrangement of supporting solder bumps 102 in accordance with a further example embodiment of the present invention. FIG. 19 is an enlarged picture showing section "D" in FIG. 18, and FIG. 20 is an enlarged picture showing section "E" in FIG. 19. Additionally, FIG. 21 is an enlarged picture showing section "F" in FIG. 19.

Figure 21:
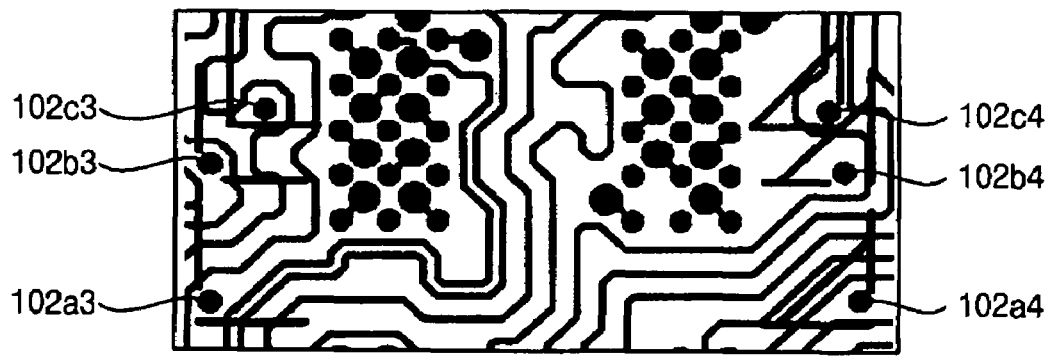
FIG. 21 is an enlarged picture showing section "F" in FIG. 19.

Referring to FIGS. 18–21, a dual module PCB 100 may be employed with various semiconductor chip packages 150 that have different chip sizes (e.g., different dimensions). Namely, the PCB 100 may include a number of supporting solder bump arrangements, each corresponding to a different sized semiconductor chip package. For example, FIGS. 20 and 21 illustrates first, second and third supporting solder bump arrangements. The first supporting solder bump arrangement includes supporting solder bumps 102a1, 102a2, 102a3 and 102a4. The second supporting solder bump arrangement includes supporting solder bumps 102b1, 102b2, 102b3 and 102b3. The third supporting solder bump arrangement includes supporting solder bumps 102c1, 102c2, 102c3 and 102c4. For example, the first supporting solder bump arrangement may be for a semiconductor chip package having a size of 11 mm×16 mm, the second supporting solder bump arrangement may be for a semiconductor chip package having a size of 11 mm×13 mm, and the third supporting solder bump arrangement may be for a semiconductor chip package having a size of 10 mm×11 mm. Although the dual module PCB 100 in FIGS. 18–21 supports three differently sized semiconductor chip packages, the PCB 100 may be easily modified so as to support less than or greater than three differently sized semiconductor chip packages.

While the supporting solder bumps 102 were described as being formed on the PCB 100 in the above-described embodiment, as an alternative, the supporting solder bumps may be formed on the semiconductor chip package 150 such that the supporting solder bumps contact the PCB 100 or leave a gap between the solder bumps and the PCB 100. Also, while the embodiments of the present invention were described using a BGA semiconductor chip package as the example semiconductor chip package, it will be understood that the present invention is not limited in application to semiconductor modules including BGA semiconductor chip packages. Instead, the semiconductor chip package 150 may be a WBGA type, BOC type, etc.

As described above, the present invention provides at least (i) a PCB having a supporting solder bump arrangement for at least one semiconductor chip package, (ii) a semiconductor module including the PCB and at least one semiconductor chip package mounted thereon, and (iii) methods of forming the PCB and the semiconductor module. When an external mechanical impact is applied to the semiconductor chip package, at least one supporting solder bump, provided on a portion of the PCB under a peripheral portion of the semiconductor chip package, helps support the semiconductor chip package and distribute the force of the impact. The supporting solder bumps may be easily formed on the PCB together with a normal solder joint by a screen printing process and without any additional process steps. Furthermore, the height of the supporting solder bump, and thus the gap between the supporting solder bump and the semiconductor chip package may be controlled.

Therefore, when the semiconductor module is socketed by a manual socketing procedure, a crack in semiconductor chip package, crack in the solder joint and/or a crack pattern on the PCB may be reduced.

The invention being thus described, it will be obvious that the same may be varied in many ways. Such variations are not to be regarded as a departure from the spirit and scope of the invention, and all such modifications are intended to be included within the scope of the invention.

What is claimed is:

1. A semiconductor module, comprising:
    at least one semiconductor chip package;
    a board having functional pads and dummy pads;
    at least one solder joint electrically connecting the semiconductor chip package and one of the functional pads of the board;
    at least one supporting solder bump formed on one of the dummy pads and disposed under a portion of the semiconductor chip package; and wherein
    the supporting solder bump is disposed under the semiconductor chip package such that a gap exists between the semiconductor chip package and the supporting solder bump.

2. The module of claim 1, wherein at least one of the dummy pads is disposed under a peripheral area of the semiconductor chip package.

3. The module of claim 1, wherein at least one of the dummy pads is disposed under a corner portion of the semiconductor chip package.

4. The module of claim 3, wherein at least two of the dummy pads are disposed under a same corner portion of the semiconductor chip package.

5. The module of claim 1, wherein the dummy pads are disposed under more than one corner of the semiconductor chip package.

6. The module of claim 1, wherein more than one dummy pad arrangement is formed on the board, each dummy pad arrangement corresponding to a different sized semiconductor chip package.

7. The module of claim 1, wherein the gaps is 10 μm to 20 μm.

8. The module of claim 7, wherein the supporting solder bump has a height of 0.24240 mm to 0.252450 mm.

9. The module of claim 1, wherein a ratio between the gap and a height of the supporting solder bump is below 0.5.

10. The module of claim 1, further comprising:
    a plurality of semiconductor chip packages;
    a plurality of solder joints electrically connecting the plurality of semiconductor chip packages to functional pads of the board.

11. The module of claim 10, wherein the supporting solder bumps are disposed under more than one of the plurality of semiconductor chip packages.

12. The module of claim 1, wherein
    the board includes functional pads and dummy pads on first and second sides thereof, the first and second sides being opposite sides of the board;
    the solder joints electrically connect a first plurality of semiconductor chip packages to the functional pads on the first side; and
    the solder joints electrically connect a second plurality of semiconductor chip packages to the functional pads on the second side.

13. A semiconductor module, comprising:
    at least one semiconductor chip package;
    a board;
    at least one solder joint electrically connecting the semiconductor chip package and the board;
    at least one supporting solder bump formed on the board under a portion of the semiconductor chip package such that a gap exists between the semiconductor chip package and the supporting solder bump.

14. The module of claim 13, wherein the supporting solder bump is disposed under a peripheral area of the semiconductor chip package.

15. The module of claim 13, wherein the supporting solder bump is disposed under a corner portion of the semiconductor chip package.

16. The module of claim 15, wherein at least two supporting solder bumps are disposed under a same corner portion of the semiconductor chip package.

17. The module of claim 13, wherein the supporting solder bumps are disposed under more than one corner of the semiconductor chip package.

18. The module of claim 13, wherein more than one supporting solder bump arrangement is formed on the board, each supporting solder bump arrangement corresponding to a different sized semiconductor chip package.

19. The module of claim 13, wherein the gaps is 10 μm to 20 μm.

20. The module of claim 19, wherein the supporting solder bump has a height of 0.24240 mm to 0.252450 mm.

21. The module of claim 13, wherein a ratio between the gap and a height of the supporting solder bump is below 0.5.

22. A semiconductor module, comprising:
   at least one semiconductor chip package;
   a board having functional pads and dummy pads;
   at least one solder joint electrically connecting the semiconductor chip package and one of the functional pads of the board; at least one supporting solder bump formed on one of the dummy pads and disposed under a portion of the semiconductor chip package; and wherein
   more than one dummy pad arrangement is formed on the board, each dummy pad arrangement corresponding to a different sized semiconductor chip package.

23. The module of claim 22, wherein at least one of the dummy pads is disposed under a peripheral area of the semiconductor chip package.

24. The module of claim 22, wherein at least one of the dummy pads is disposed under a corner portion of the semiconductor chip package.

25. The module of claim 24, wherein at least two of the dummy pads are disposed under a same corner portion of the semiconductor chip package.

26. The module of claim 22, wherein the dummy pads are disposed under more than one corner of the semiconductor chip package.

27. The module of claim 22, wherein more than one dummy pad arrangement is formed on the board, each dummy pad arrangement corresponding to a different sized semiconductor chip package.

28. The module of claim 22, wherein the supporting solder bump contacts the semiconductor chip package.

29. A semiconductor module, comprising:
   at least one semiconductor chip package;
   a board having functional pads and dummy pads;
   at least one solder joint electrically connecting the semiconductor chip package and one of the functional pads of the board;
   at least one supporting solder bump formed on one of the dummy pads and disposed under a portion of the semiconductor chip package; and wherein
   more than one supporting solder bump arrangement is formed on the board, each supporting solder bump arrangement corresponding to a different sized semiconductor chip package.

30. The module of claim 29, wherein the supporting solder bump is disposed under a peripheral area of the semiconductor chip package.

31. The module of claim 29, wherein the supporting solder bump is disposed under a corner portion of the semiconductor chip package.

32. The module of claim 31, wherein at least two supporting solder bumps are disposed under a same corner portion of the semiconductor chip package.

33. The module of claim 29, wherein the supporting solder bumps are disposed under more than one corner of the semiconductor chip package.

34. The module of claim 29, wherein the supporting solder bump contacts the semiconductor chip package.

35. A semiconductor module, comprising:
   a plurality of semiconductor chip packages;
   a board having functional pads and dummy pads;
   a plurality of solder joints electrically connecting the plurality of semiconductor chip packages to functional pads of the board; and
   at least one supporting solder bump formed on one of the dummy pads and disposed under a portion of the semiconductor chip package.

36. The module of claim 35, wherein the supporting solder bumps are disposed under more than one of the plurality of semiconductor chip packages.

* * * * *